United States Patent
Yoshida

(10) Patent No.: US 7,448,882 B2
(45) Date of Patent: Nov. 11, 2008

(54) CONNECTOR

(75) Inventor: Shin Yoshida, Miyagi-ken (JP)

(73) Assignee: Alps Electronic Co., Ltd., Tokyo (JP)

( * ) Notice: Subject to any disclaimer, the term of this patent is extended or adjusted under 35 U.S.C. 154(b) by 0 days.

(21) Appl. No.: 11/880,344

(22) Filed: Jul. 19, 2007

(65) Prior Publication Data
US 2007/0264848 A1   Nov. 15, 2007

Related U.S. Application Data

(62) Division of application No. 10/889,767, filed on Jul. 12, 2004.

(30) Foreign Application Priority Data
Aug. 1, 2003   (JP)   ............................. 2003-284627

(51) Int. Cl.
*H01R 12/00*   (2006.01)

(52) U.S. Cl. .......................................... 439/81; 439/66
(58) Field of Classification Search .................. 439/66, 439/70, 71, 700, 824, 840, 438, 387, 436, 439/81, 82
See application file for complete search history.

(56) References Cited

U.S. PATENT DOCUMENTS

| 5,810,609 A | 9/1998 | Faraci |
| 6,517,362 B2 | 2/2003 | Hirai et al. |
| 2003/0042595 A1 | 3/2003 | Canella |

*Primary Examiner*—Felix O. Figueroa
(74) *Attorney, Agent, or Firm*—Beyer Law Group LLP

(57) ABSTRACT

A connector for connecting with an external terminal on an electronic component includes a spiral contact which is wound a plurality of turns. The spiral contact has a single projection that projects outwardly toward an outer circumference of the turns. When the spiral contact is in contact with the external terminal, the projection of the spiral contact comes into contact with the external terminal.

7 Claims, 7 Drawing Sheets

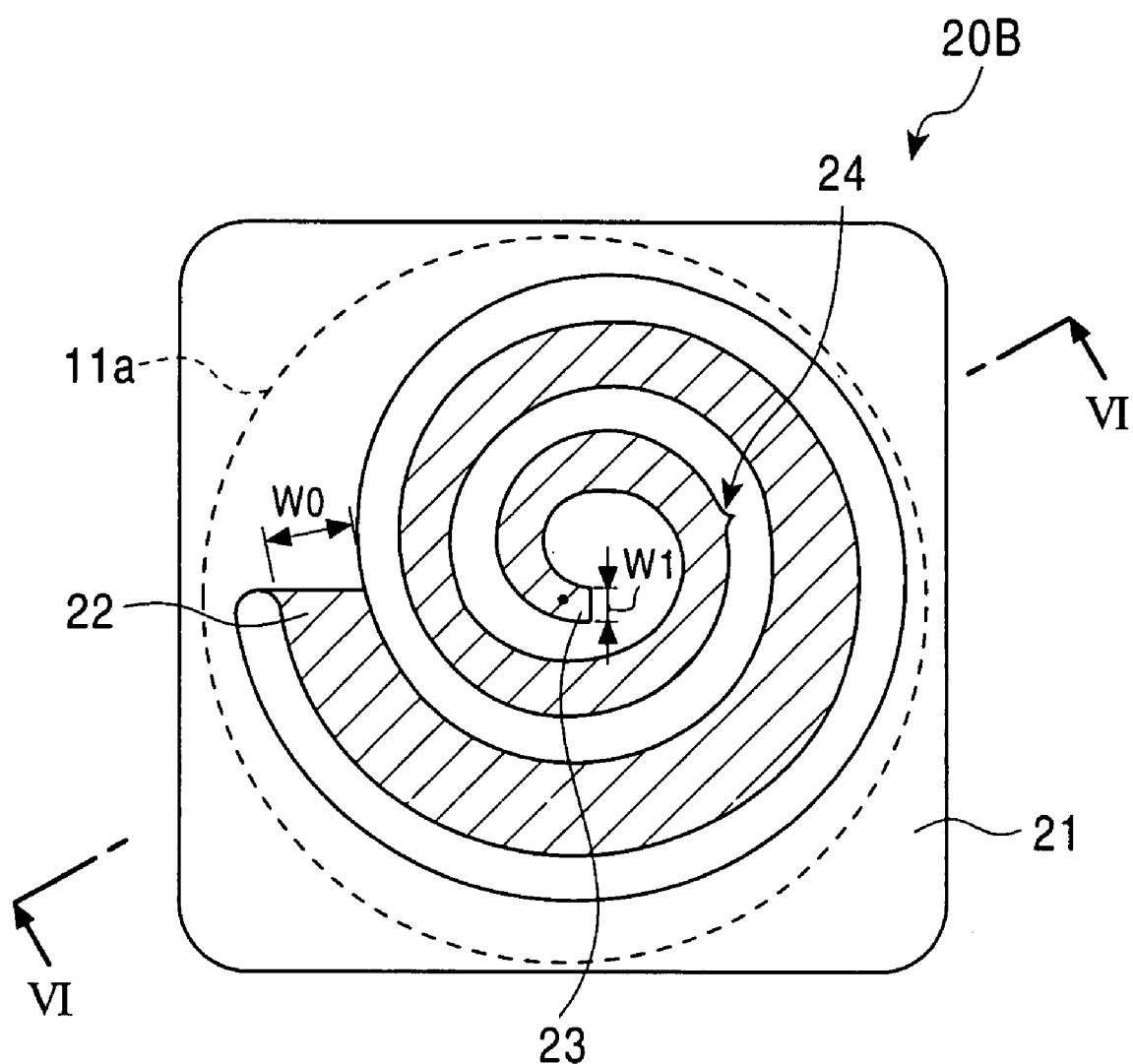

CONNECTOR

CROSS-REFERENCE TO RELATED APPLICATION

This application is a divisional of U.S. patent application Ser. No. 10/889,767 filed on Jul. 12, 2004, in the name of Shin Yoshida, and entitled "CONNECTOR," which is incorporated herein by reference in its entirety and for all purposes.

BACKGROUND OF THE INVENTION

1. Field of the Invention

The present invention relates to a connector included in a testing socket having, for example, an electronic component such as a semiconductor. More specifically, the invention relates to a connector that provides a stable electrical connection between a connection terminal on the electronic component and a connection terminal on the testing socket.

2. Description of the Related Art

The semiconductor testing apparatus disclosed in Japanese Unexamined Patent Application Publication No. 2002-175859 provides an interim electrical connection between a semiconductor and an external circuit board. A grid or matrix consisting of a plurality of spherical contacts is disposed on the back side of the semiconductor. A plurality of depressions is formed on an insulating substrate opposing the back side of the semiconductor. In these depressions, spiral contacts are disposed such that they oppose the spherical contacts.

When the back side of the semiconductor is pressed towards the insulating substrate, the spiral contact wraps around and comes in contact with the outer surface of the spherical contact. In this way, the spherical contacts and the spiral contacts are reliably connected electrically.

SUMMARY OF THE INVENTION

For the above-mentioned semiconductor testing apparatus, the characteristics of the semiconductor have to be measured with high accuracy. In order to do so, spiral contacts on the semiconductor testing apparatus and the spherical contacts on the semiconductor must be stably connected.

There is, however, a case in which, for example, the spiral contacts undergo plastic deformation or different pressure is applied to different areas due to restrictions such as the shape of the semiconductor. In such a case, the location of the electrical contact point between each pair of spherical contact and spiral contact differs in that, for example, a contact point is formed near the root of the spiral contact and another contact point is formed near the tip of the spiral contact. This is a problem because maintaining a stable electrical connection between the spiral contacts and the spherical contacts becomes difficult.

It is often believed that a stable electrical connection can be obtained by increasing the pressure applied to the contact points between the spiral contacts and the spherical contacts by increasing the pressure applied to the semiconductor.

However, increasing the pressure applied to the semiconductor is not necessarily the best solution because there is a limit to the amount of pressure that can be applied to the semiconductor and because it is preferable to apply less pressure to prevent damaging the semiconductor. Another reason is that the amount of pressure applied to each contact point decreases as the number of contact points increase and, thus, sufficient pressure may not be applied to each contact point.

An object of the present invention is to solve the above-mentioned problems and to provide a connector that is capable of forming a stable electrical connection between the spiral contacts on the testing apparatus and the spherical contacts on the electronic component, such as a semiconductor, while less pressure is applied to the contact points. In other words, while the spring pressure of the entire spiral contact is maintained constant, the contact area is minimized and the contact pressure per unit area is increased so that the film on the surface of the contact point can be easily removed.

A connector for connecting with an external terminal on an electronic component includes a spiral contact which is wound a plurality of turns. The spiral contact has a single projection that projects outwardly toward an outer circumference of the turns. When the spiral contact is in contact with the external terminal, the projection of the spiral contact comes into contact with the external terminal.

In one example embodiment of the invention, the projection is formed in a vicinity of a tip of the spiral contact. In another example embodiment of the invention, an end of the projection constitutes an acute angle.

In the connector according to the present invention, a protrusion that is a discontinuous contact point formed on the spiral contact on the connector comes into contact with parts of the spherical contact on the semiconductor. In this way, an electrical connection between the two contacts can be maintained. In particular, since the spiral contact and the spherical contact come into contact at the protrusion, the electrical connection between these contacts can be stabilized.

BRIEF DESCRIPTION OF THE DRAWINGS

FIG. 4 is a cross-sectional view taken along line IV-IV of FIG. 3 in which the area between a spiral contact and a spherical contact is partially enlarged.

FIG. 5 is a plan view of a spiral contact according to a second embodiment of the present invention.

DESCRIPTION OF THE PREFERRED EMBODIMENTS

Figure 1:
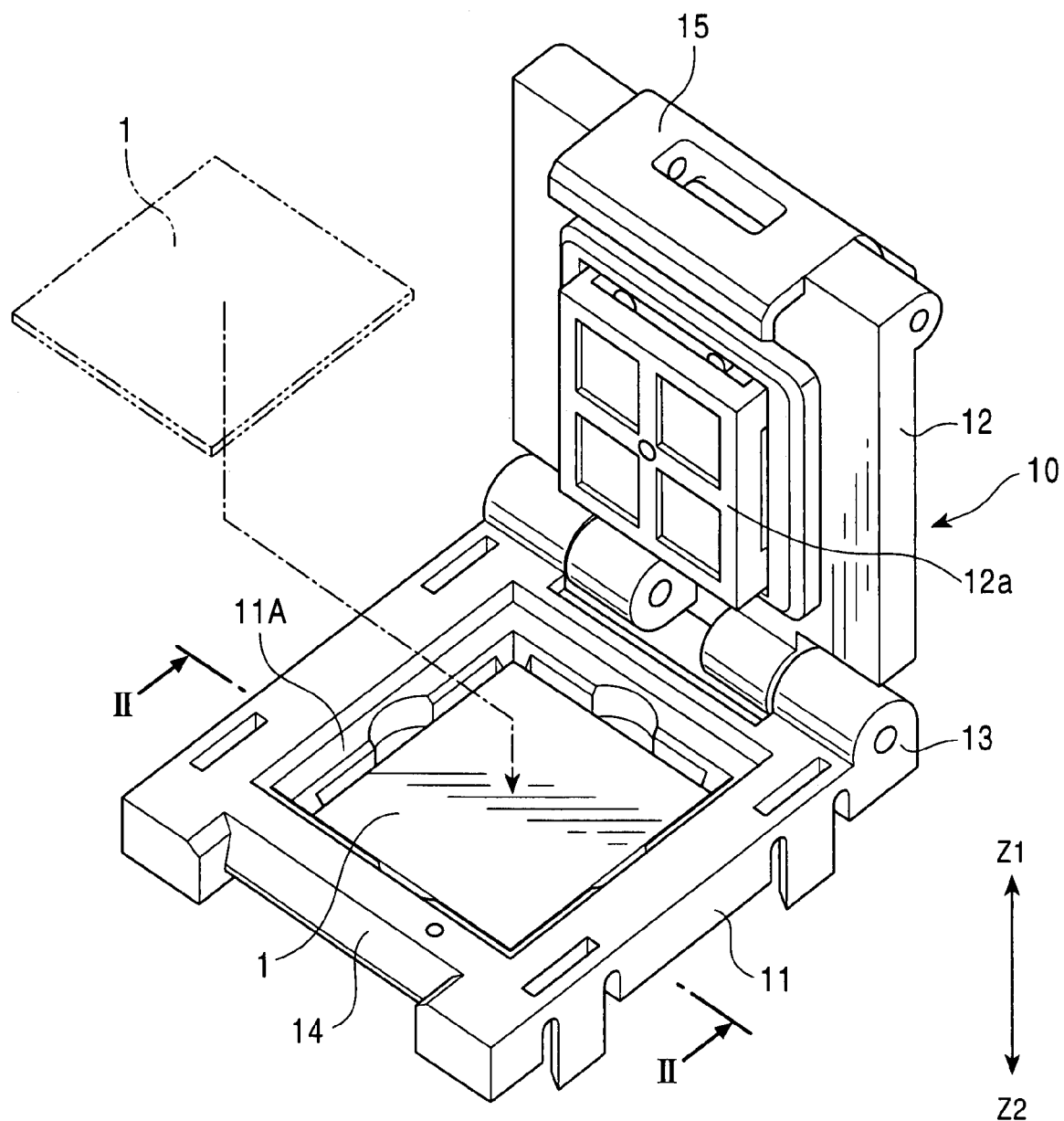
FIG. 1 is a perspective view of a testing socket used for testing the operation of an electronic component.
Figure 2:
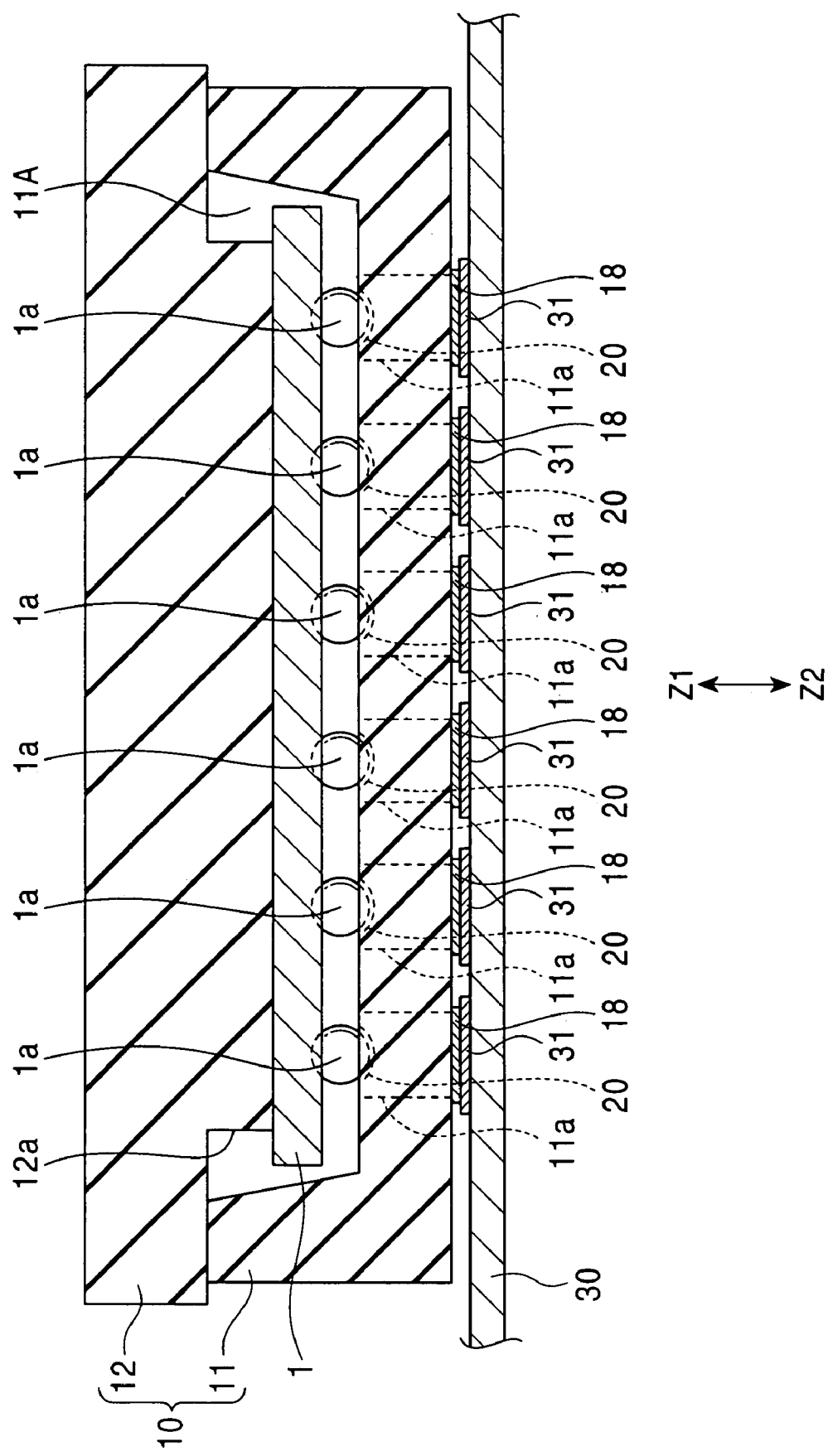
FIG. 2 is a cross-sectional view taken along line II-II of FIG. 1 of the testing socket including the electronic component.

FIG. 1 is a perspective view of a testing socket for testing the operation of an electronic component. FIG. 2 is a cross-sectional view taken along line II-II of FIG. 1 and illustrates the testing socket including the electronic component.

As illustrated in FIG. 1, a testing socket 10 includes a base 11 and a cover 12 rotatably supported at one of the edges of the base 11 by a hinge 13. The base 11 and the cover 12 are composed of a material such as an insulating resin. On the central part of the base 11, a loading region 11A that is a depression towards the Z2 direction in the drawing is formed. An electronic component 1 such as a semiconductor can be disposed in the loading region 11A. At the other edge of the base 11, a lock-receiving member 14 is formed. On the cover 12, a locking member 15 that engages with the lock-receiving member 14 is formed.

As illustrated in FIG. 2, the testing socket 10 is for conducting a test on the electronic component 1 including a matrix (or grid) of a plurality of spherical contacts (external terminals) 1a disposed on the lower surface.

As illustrated in FIG. 2, the loading region 11A has a predetermined diameter. A plurality of depressions (through-holes) 11a penetrating from the front surface of the loading region 11A to the back surface of the base 11 is formed to correspond to each of the spherical contacts 1a of the electronic component 1. The upper surface of the depressions 11a (the front surface of the loading region 11A) includes spiral contacts (connection terminals) 20.

Figure 4A:
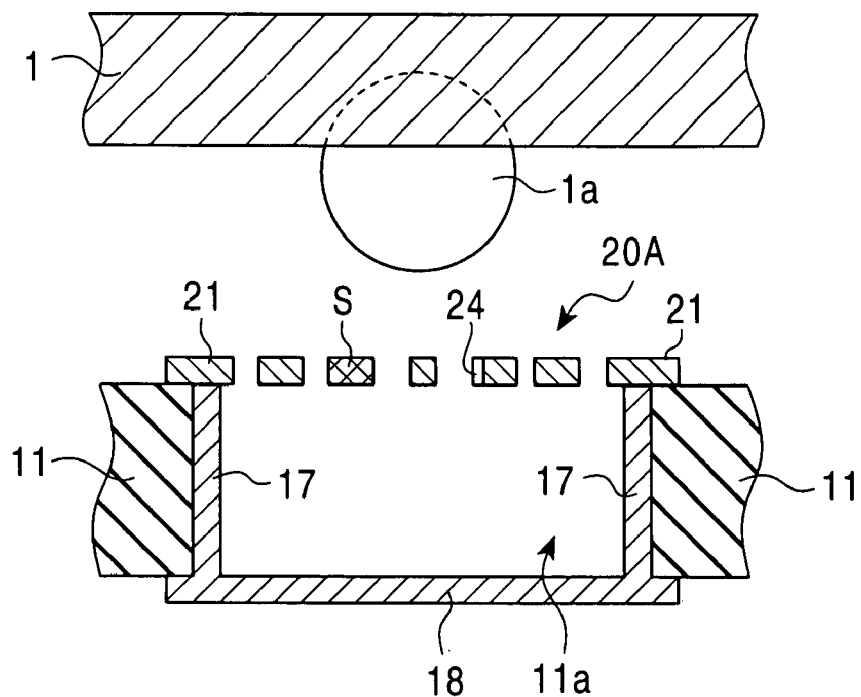
FIG. 4A illustrates the state before the contacts come in contact.
Figure 4B:
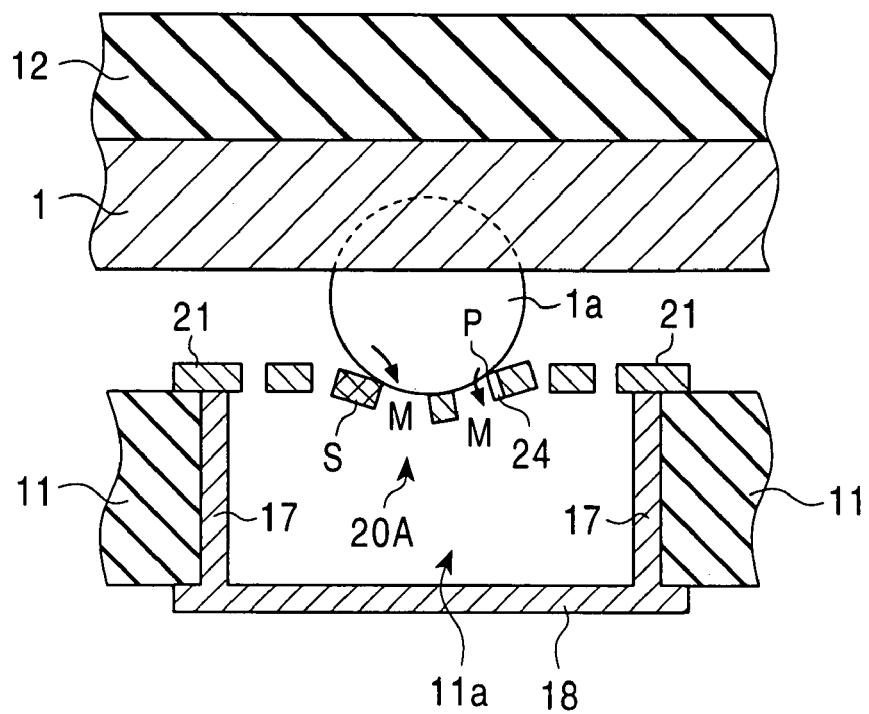
FIG. 4B illustrates the state after the contacts come in contact.

On the inner wall of the depressions 11a, plated conductive regions 17 are formed (refer to FIG. 4B). The upper edge of the plated conductive regions 17 and a base 21 of the spiral contacts 20 are connected by, for example, a conductive adhesive. The lower edge of the lower opening of the depressions 11a is covered with a connection terminal 18 connected to the conductive regions 17.

As illustrated in FIG. 2, at the lower area of the base 11, a printed board 30 including a plurality of electrical lines and other circuit components is disposed. The base 11 is fixed on the printed board 30. On the front surface of the printed board 30, an opposing electrode 31 opposing the connection terminal 18 on the bottom surface of the base 11 is disposed. When each connection terminal 18 comes into contact with the corresponding opposing electrode 31, the electronic component 1 and the printed board 30 are electrically connected via the testing socket 10.

On the center of the inner surface of the cover 12 of the testing socket 10, a pressing member 12a projecting downwards (in the drawing) to press down the electronic component 1 is formed so that it opposes the loading region 11A. In the area opposite the hinge 13, the locking member 15 is formed.

A biasing member (not depicted in the drawings) including a coil spring for biasing the pressing member 12a in a direction away from the inner surface of the cover 12 is disposed between the cover 12 and the pressing member 12a. Thus, when the electronic component 1 is disposed in the depressions 11a and the cover 12 is closed by engaging the locking member 15 with the lock-receiving member 14, the electronic component 1 is resiliently pressed in the direction towards the front surface of the loading region 11A (direction Z2).

The size of the loading region 11A of the base 11 is substantially the same as the outline of the electronic component 1. Thus, when the electronic component 1 is disposed in the loading region 11A and the cover 12 is locked, the spherical contacts 1a on the electronic component 1 and the corresponding spiral contacts 20 on the testing socket 10 are accurately aligned.

First Embodiment

Figure 3:
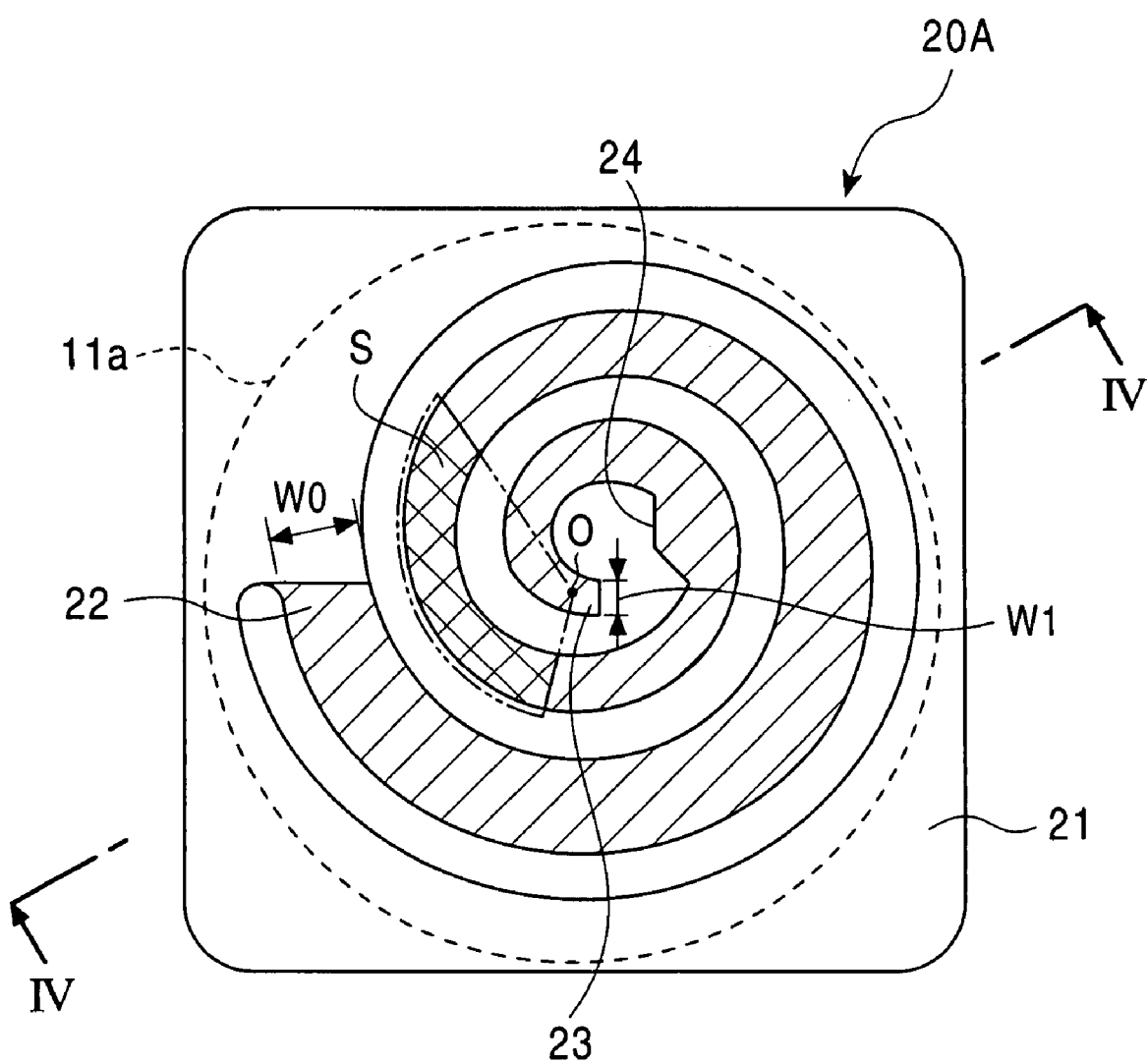
FIG. 3 is a plan view of a spiral contact according to a first embodiment of the present invention.

FIG. 3 is a plan view of spiral contacts according to a first embodiment of the present invention. FIG. 4 is a cross sectional view taken along line IV-IV of FIG. 3 in which the area between a spiral contact and a spherical contact is partially enlarged. FIG. 4A illustrates the state before the contacts come in contact, and FIG. 4B illustrates the state after the contacts come into contact.

A spiral contact 20A illustrated in FIG. 3 is formed flush with a plane. The periphery of the spiral contact 20A is surrounded by a square base 21. The base 21 is fixed to the edge of the upper opening of a depression 11a.

As illustrated in FIG. 3, a root 22 of the spiral contact 20A is located at the base 21, and a tip 23 extending in a spiral from the root 22 is located at the center of the depression 11a.

For the spiral contact 20A according to the first embodiment illustrated in FIG. 3, the width of the root 22 is W0 and the width of the tip 23 is W1, which is slightly smaller than W0 (W0>W1). The width of the spiral contact 20A becomes continuously smaller at a predetermined rate from the root 22 having a width of W0 to the tip 23 having a width of W1.

If the entire length of the spiral contact 20A, from the root 22 to the tip 23, is L and the length from the root 22 to a predetermined position closer to the tip 23 is X (where 0<X<L), the width of the spiral contact 20A at a predetermined position X can be indicated by Formula 1 below.

$$W = \frac{W1 - W0}{L} \cdot X + W0 \qquad \text{[Formula 1]}$$

The spiral contact 20A according to the first embodiment, however, includes a discontinuous contact region 24 having a width that differs from the width determined by Formula 1 and being formed at a predetermined position between the root 22 and the tip 23. In other words, the discontinuous contact region 24 is a protrusion protruding from the side of the spiral contact 20A towards the center and which is flush with the spiral contact 20A (the discontinuous contact region 24 is a protrusion on the inner circumference).

The width W of the spiral contact 20A according to the present invention is not limited to the above and may be constant for the entire length of the spiral contact 20A (W0=W1). Moreover, if the resilient strength in the Z direction can be maintained, the width of the spiral contact may be W0<W1.

As illustrated in FIG. 4B, when the locking member 15 of the cover 12 is engaged with the lock-receiving member 14 of the base 11, the electronic component 1 is pushed downwards (in the drawing) by the pressing member 12a. Therefore, each of the spherical contacts 1a pushes each of the corresponding spiral contacts 20A towards the inside of the depressions 11a (downwards in the drawing). Simultaneously, the outline of the spiral contact 20A is deformed so that it expands from the tip 23 towards the root 22 (from the center of the spiral to the periphery of the spiral). In this way, the spiral contacts 20A wrap around the outer surface of the spherical contacts 1a to electrically connect the spherical contacts 1a and the spiral contacts 20.

Hence, the spherical contacts 1a and the corresponding spiral contacts 20 constitute connectors for electrically connecting the electronic component 1 and an electrical circuit on the printed board 30. At this time, the angular portion at the tip of the discontinuous contact region 24 comes into contact with the surface of the corresponding spherical contact 1a first since the discontinuous contact region 24 of the spiral contact 20A protrudes in the width direction of the spiral contact 20A,. In other words, the spiral contact 20A and the corresponding spherical contact 1a can always be electrically connected via a contact point P on the angular portion at the tip of the discontinuous contact region 24 and the surface of the corresponding spherical contact 1a. Thus, the distance from the root 22 of the spiral contact 20A and the contact point P becomes constant. In this way, a change in the electrical characteristics such as a contact resistance that easily changes every time the spiral contact 20A and the spherical contact 1a come into contact can be suppressed, and the electrical connection between the spiral contact 20A and the spherical contact 1a can be stabilized.

The preferable size of the contact point P for this case is 100 μm or less in diameter.

The spiral contact 20A illustrated in FIG. 3 includes a narrow region S that has a smaller width than the regular width of the spiral contact 20A (i.e., the narrow region S has a width smaller than the width W calculated from Formula 1 or the predetermined constant width). A narrow region S is formed in an area opposing the discontinuous contact region 24 in respect to the central axis O and one turn outwards from the discontinuous contact region 24.

If such a narrow region S is formed, as illustrated in FIG. 4B, when the spherical contacts 1a come in contact with the surface of the spiral contact 20A, the inner circumference of the narrow region S is tilted and pressed downwards in the Z2 direction more than the outer periphery. At this time, a torsional moment M is applied to the narrow region S of the spiral contact 20A in a clockwise direction, as illustrated in the drawing. Similarly, as illustrated in the drawing, a counter-clockwise torsional moment M is applied to the area opposing the narrow region S in respect to the central axis O. For this reason, the discontinuous contact region 24 of the spiral contact 20A is also tilted and the inner circumference is pressed downwards.

Accordingly, as illustrated in FIG. 4B, the tip of the angular portion of the discontinuous contact region 24 easily comes into contact with the surface of the spherical contact 1a, and the contact point P can be formed between each spiral contact 20A and the tip of the angular portion of the corresponding spherical contact 1a. Therefore, when the pressure applied to the contact points between the spiral contacts 20A and the spherical contacts 1a is small, or, in other words, when a plurality of spherical contact regions of the electronic component 1 and a plurality of spiral contacts 20A of the testing socket 10 are connected, each of the spherical contacts 1a and the corresponding spiral contacts 20A come into contact via each contact point P. In this way, the electrical connection between the spherical contacts 1a and the corresponding spiral contacts 20A becomes stable.

Second Embodiment

Figure 6:
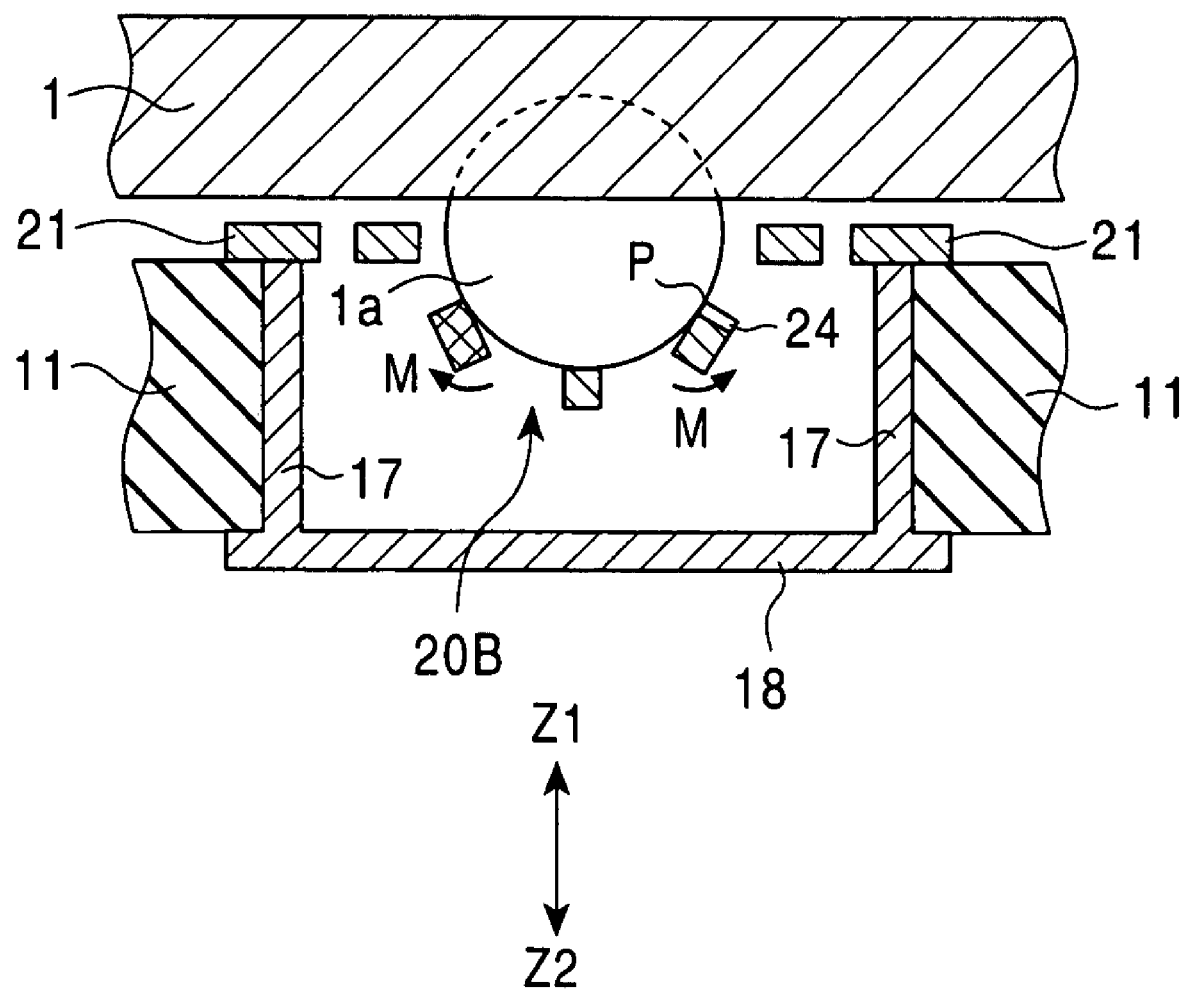
FIG. 6 is a cross-sectional view taken along line VI-VI of FIG. 5 illustrating a state in which a spiral contact and a spherical contact are in contact.

FIG. 5 is a plan view of a spiral contact according to a second embodiment of the present invention. FIG. 6 is a cross-sectional view taken along line VI-VI of FIG. 5 and illustrates the connection between a spiral contact and a spherical contact.

A spiral contact 20B according to the second embodiment illustrated in FIG. 5 differs from the spiral contact 20A according to the first embodiment in that the discontinuous contact region 24 is a protrusion protruding towards the outer circumference of the spiral contact 20B instead of protruding towards the inner circumference (the discontinuous contact region 24 is a protrusion on the outer circumference).

As illustrated in FIG. 6, similar to that described above, for the spiral contact 20B according to the second embodiment, when the electronic component 1 is pressed towards the Z2 direction, the tip of the angular portion of the discontinuous contact region 24 of the spiral contact 20B comes into contact with the surface of a spherical contact 1a to form a contact point P. The spherical contact 1a and the spiral contact 20B are electrically connected via the contact point P. Thus, similar to the first embodiment, the electrical connection between the spiral contact 20B and the spherical contact 1a is stabilized.

The spiral contact 20B according to the second embodiment is particularly effective when a large torsional moment is applied to the spiral contact 20B because the diameter of the spherical contact 1a is small or when the pressure applied to the contact point in the Z2 direction is large.

Third Embodiment

Figure 7:
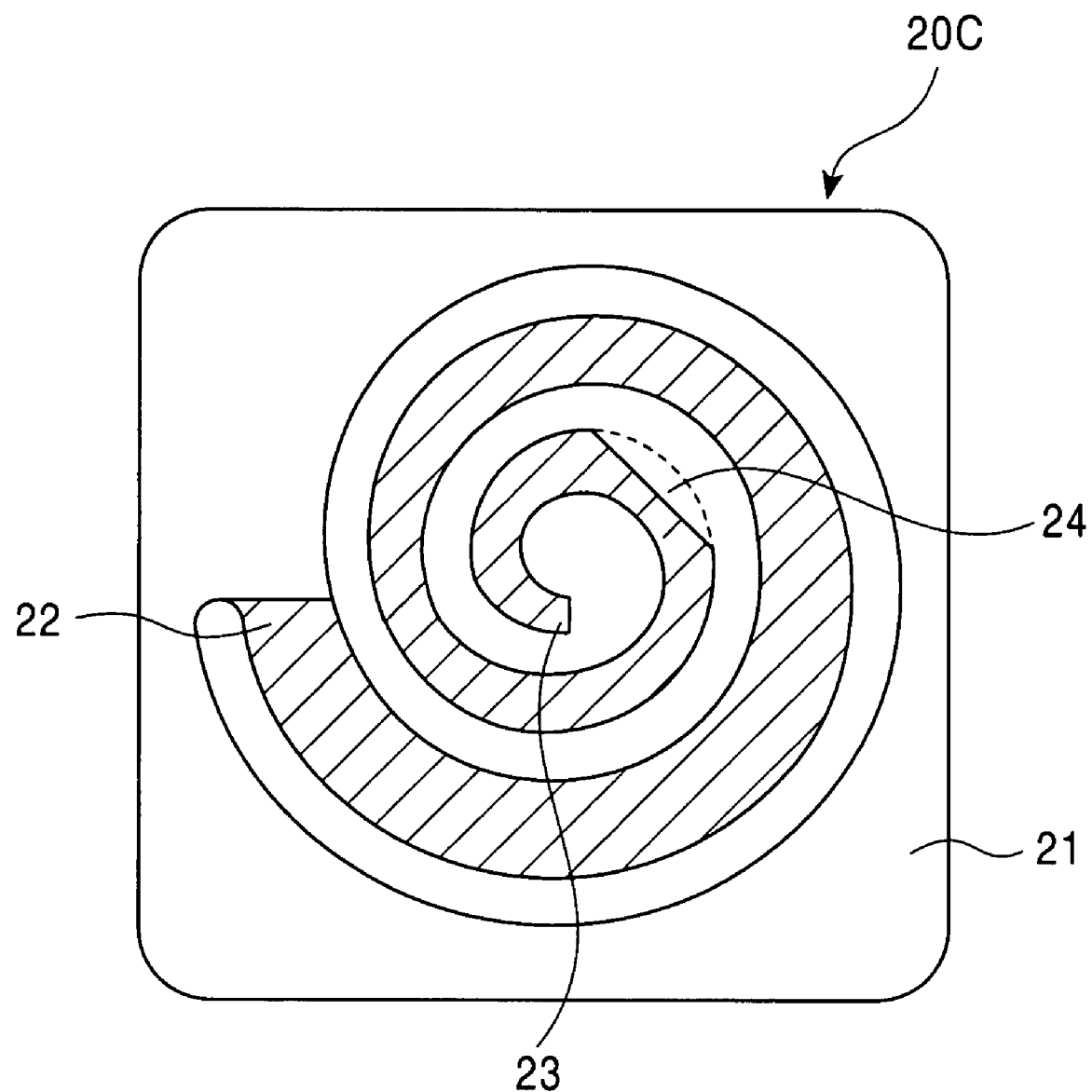
FIG. 7 is a plan view of a spiral contact according to a third embodiment of the present invention.

FIG. 7 is a plan view of a spiral contact according to a third embodiment of the present invention.

A spiral contact 20C according to the third embodiment differs from the spiral contacts 20A and 20B according to the first and the second embodiments, respectively, in that the discontinuous contact region 24 is not a protrusion and, instead, is a notch in the spiral contact 20C. Even if the discontinuous contact region 24 is a notch, the discontinuous contact region 24 can partially come into contact with the surface of a spherical contact 1a and form a contact point P similar to that described above.

Since the discontinuous contact region 24 according to the first and second embodiments is a protrusion and a two-dimensional structure formed on a plane, it can be formed easily by common methods such as photolithography.

In the above embodiments, the discontinuous contact region 24 is formed on one location on the spiral contact 20. The discontinuous contact region 24 according to the present invention, however, is not limited to one location and may be formed in a plurality of locations. When a plurality of discontinuous contact regions 24 are formed, a plurality of contact points P are also formed. Thus, the electrical connection between the spiral contacts 20 and the spherical contacts 1a can be stabilized even more.

In the above embodiments, the contact for the testing socket was a spherical contact (ball grid array (BGA)). The present invention, however, is not limited to this and, for example, a land grid array (LGA), ellipsoid contact, a cone contact, or a polygonal pyramid contact may be used.

What is claimed is:

1. A connector for connecting with an external terminal on an electronic component, comprising:
    a spiral contact which is wound a plurality of turns, wherein
    the spiral contact has a single projection that projects outwardly toward an outer circumference of the turns, the spiral contact having no other projections, and
    when the spiral contact is in contact with the external terminal, the single projection of the spiral contact comes into contact with the external terminal.

2. The connector of claim 1, wherein the projection is formed in a vicinity of a tip of the spiral contact.

3. The connector of claim 1, wherein an end of the projection constitutes an acute angle.

4. The contact of claim 1, wherein the single projection is provided on an outer edge of the spiral contact.

5. A connector for connecting with an external terminal on an electronic component, the connector comprising:
    a spiral contact, including:
        a peripheral base portion;
        a single spiral arm extending inwardly from the base portion and forming a plurality of turns, the spiral arm having an inner edge, an outer edge, and a tip located substantially at a center of the turns; and
        a single projection projecting from the outer edge of the spiral arm outwardly toward the peripheral base portion, the spiral arm having no other projections thereon, wherein the spiral contact comes into contact with the external terminal by the single projection.

6. The connector of claim 5, wherein the single projection is formed in a vicinity of the tip of the spiral contact.

7. The connector of claim 5, wherein an end of the projection constitutes an acute angle.

* * * * *